United States Patent
Hong et al.

(10) Patent No.: US 7,649,760 B2
(45) Date of Patent: Jan. 19, 2010

(54) SEMICONDUCTOR MEMORY DEVICE HAVING DUMMY SENSE AMPLIFIERS AND METHODS OF UTILIZING THE SAME

(75) Inventors: Min-Ki Hong, Gyeonggi-do (KR); Sang-Seok Kang, Gyeonggi-do (KR); Dong-Min Kim, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 205 days.

(21) Appl. No.: 11/465,304

(22) Filed: Aug. 17, 2006

(65) Prior Publication Data

US 2007/0041260 A1 Feb. 22, 2007

(30) Foreign Application Priority Data

Aug. 19, 2005 (KR) .................. 10-2005-0076281
Feb. 9, 2006 (KR) .................. 10-2006-0012383

(51) Int. Cl.
    *G11C 5/02* (2006.01)
(52) U.S. Cl. .................. 365/51; 365/63; 365/207; 365/205
(58) Field of Classification Search .................. 365/207, 365/51, 63
    See application file for complete search history.

(56) References Cited

U.S. PATENT DOCUMENTS

| 5,134,588 A * | 7/1992 | Kubota et al. .............. 365/207 |
| 5,844,833 A | 12/1998 | Zagar et al. |
| 5,862,072 A | 1/1999 | Raad et al. |
| 6,356,474 B1 | 3/2002 | Bissey et al. |
| 6,650,584 B2 * | 11/2003 | Cowles .................. 365/201 |

* cited by examiner

*Primary Examiner*—Hoai V Ho
*Assistant Examiner*—Kretelia Graham
(74) *Attorney, Agent, or Firm*—Stanzione & Kim, LLP

(57) ABSTRACT

A semiconductor memory device having dummy sense amplifiers and a method of utilizing the same are provided. Embodiments of the semiconductor memory device may include at least one dummy cell block including dummy cells and memory cells. Normal bit lines connecting the memory cells in the dummy cell block in a first direction and dummy bit lines connecting the dummy cells in the first direction. A dummy sense amplifier is also included for connecting any two of the normal bit lines and the dummy bit lines. Some of the embodiments may improve the sensing margin and refresh margin in sensing memory cells in the dummy cell, as well as increasing the redundancy efficiency and utilization of the dummy cells.

12 Claims, 11 Drawing Sheets

SEMICONDUCTOR MEMORY DEVICE HAVING DUMMY SENSE AMPLIFIERS AND METHODS OF UTILIZING THE SAME

CROSS-REFERENCE TO RELATED APPLICATION

This application claims the benefit of Korean Patent Application No. 10-2005-76281, filed Aug. 19, 2005, and Korean Patent Application No. 10-2006-12383, filed Feb. 9, 2006, the disclosures of which we incorporate by reference.

BACKGROUND

1. Technical Field

The present invention relates to a semiconductor memory device having dummy sense amplifiers and methods of utilizing the same, and more particularly, to a semiconductor memory device having dummy sense amplifiers and a methods of utilizing the same to maximize a refresh margin and a data sensing margin and to repair normal cells.

2. Discussion of Related Art

In general, as semiconductor memory devices become more highly integrated and have increasingly high performance standards, the structure of a cell array including memory cells, bit lines, word lines, sense amplifiers, and the like in the semiconductor memory devices must be continually improved.

For example, in dynamic random access memory (DRAM), several methods for implementing a sense amplifier in the device have been proposed and include an open bit line method, a relax open bit line method, and a folded bit line method.

Because the open bit line method allows memory cells to be laid out at all intersections between bit lines and word lines, the open bit line method may have the advantage of reducing the area of a memory cell portion. However, since the sense amplifiers need to be laid out at every bit line pitch between two cell blocks, it is very difficult to lay out the sense amplifiers.

In the relax open bit line method, memory cells are laid out at all intersections between word lines and bit lines, and one sense amplifier is laid out in two bit line pitches. Therefore, the relax open bit line method may facilitate the laying out of the sense amplifiers, especially compared to the open bit line method.

The folded bit line method further allows memory cells to be laid out at the half of all intersections between word lines and bit lines. However, this may increase the size of the memory cell region and thus the chip size. One sense amplifier is allowed to be laid out in four bit line pitches. Hence, the folded bit line method can provide an easier design, as compared to the open bit line method, and is robust against noise because a bit line pair is formed in one cell block.

Among the sense amplifier implementing methods described above, the open bit line method requires a very strict design dimension of the sense amplifier and does not provide for an easy layout of the sense amplifier even though the memory cell area is small. The folded bit line method can significantly reduce the design dimension of the sense amplifier, but increases the area of the memory cell and the chip size. Accordingly, any of the methods can be selected, where the selection will depend on the implementation purpose or a user request.

SUMMARY

Embodiments of the present invention provide a semiconductor memory device having dummy sense amplifiers and methods of utilizing the memory device having the dummy sense amplifiers to solve the aforementioned problems. In particular, embodiments of the present invention may provide a memory device and a method of utilizing the memory device to increase the sensing margin in sensing data, increase the refresh margin, and increase redundancy efficiency by repairing normal cells.

One exemplary embodiment of the present invention includes a semiconductor memory device including at least one dummy cell block that includes dummy cells and memory cells. The semiconductor memory device further includes a plurality of normal bit lines for connecting the memory cells in the dummy cell block together in a particular direction. The device also includes dummy bit lines that connect the dummy cells together in the particular direction and includes dummy sense amplifiers to connect any two of the normal bit lines to the dummy bit lines.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

The present invention will now be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art.

Figure 1:
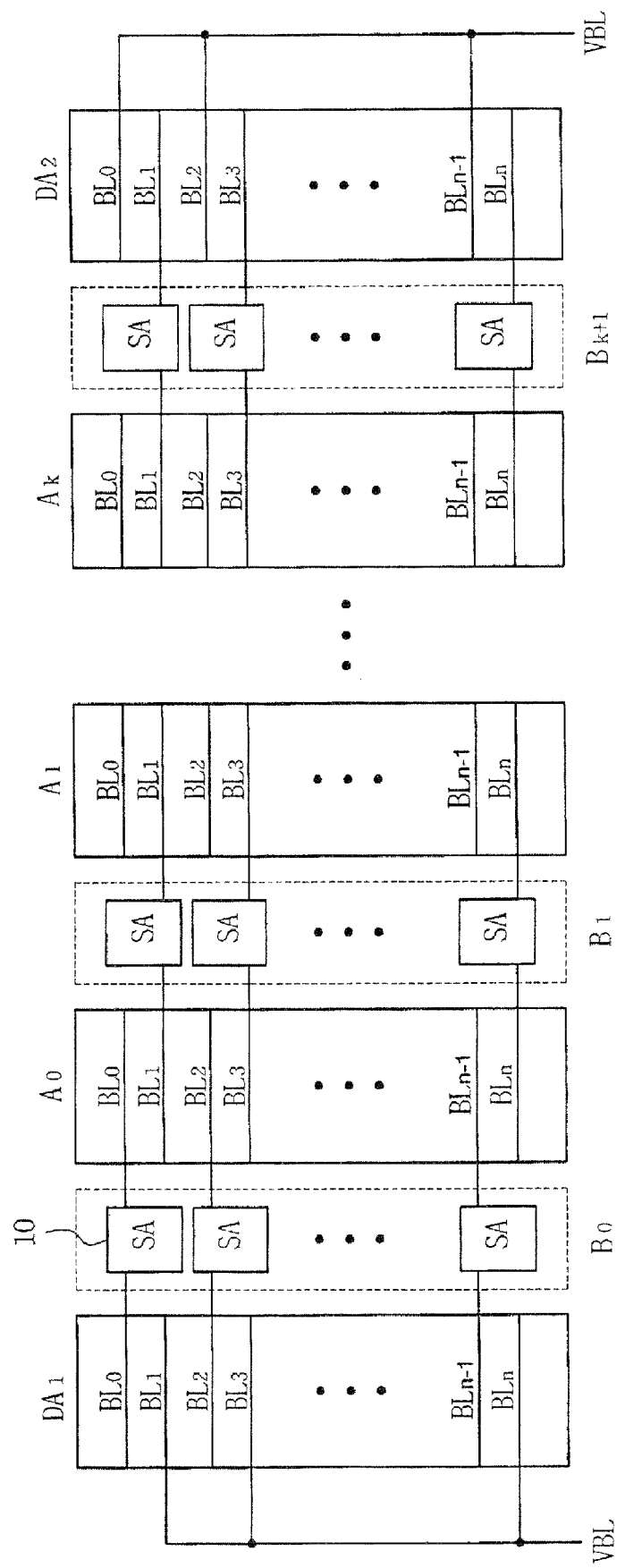
FIG. 1 illustrates an example of the structure of a cell array in a semiconductor memory device.
Figure 2:
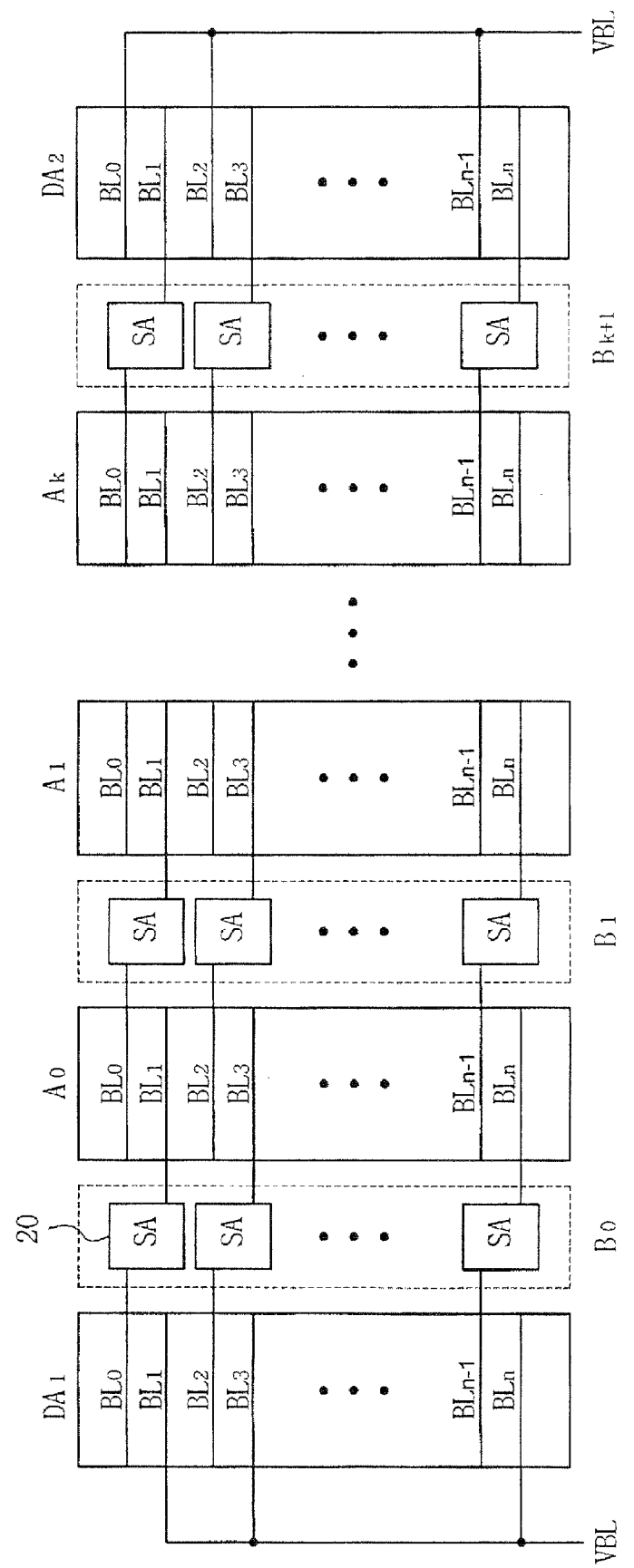
FIG. 2 illustrates another example of the structure of a cell array in a semiconductor memory device.

FIGS. 1 and 2 illustrate the structures of memory cell arrays using the relaxed open bit line method. The arrays of FIGS. 1 and 2 have the same structure except for the connection of sense amplifiers.

Referring to FIGS. 1 and 2, a memory cell array for a semiconductor memory device includes k+1 (k is a natural number) normal memory cell blocks $A_0$ to $A_k$, and first and second dummy cell blocks $DA_1$ and $DA_2$.

The first dummy cell block $DA_1$ is located at one edge of the normal memory cell blocks $A_0$ to $A_k$, i.e., at the left of the zeroth normal memory cell block $A_0$, and the second dummy cell block $DA_2$ is located at the other edge of the normal memory cell block $A_0$ to $A_k$, i.e., at the right of the k-th normal memory cell block $A_k$.

The memory cell array includes sense amplifier blocks $B_0$ to $B_{k+1}$ each having a number of sense amplifiers SA between the normal memory cell blocks $A_0$ to $A_k$ and the first and second dummy cell blocks $DA_1$ and $DA_2$. Bit lines BL formed in the normal memory cell blocks $A_0$ to $A_k$ and the first and second dummy cell blocks $DA_1$ and $DA_2$ are connected to the sense amplifiers SA, respectively.

The zeroth normal memory cell block $A_0$ will be described by way of example in detail.

The zeroth normal memory cell block $A_0$ includes a plurality of memory cells laid out in a predetermined structure. For example, the memory cells may be connected to normal bit lines BL in a column direction and to word lines (not shown) in a row direction.

The zeroth sense amplifier block $B_0$ and the first sense amplifier block $B_1$ are laid out on either side of the zeroth normal memory cell block $A_0$. The normal bit lines BL formed in the zeroth normal memory cell block $A_0$ are alternately connected to sense amplifiers SA of the zeroth sense amplifier block $B_0$ and sense amplifiers SA of the first sense amplifier block $B_1$. That is, if the zeroth normal bit line $BL_0$ in the zeroth normal memory cell block $A_0$ is connected to the sense amplifier SA in the zeroth sense amplifier block $B_0$, the first normal bit line $BL_1$ is connected to the sense amplifier SA in the first sense amplifier block $B_1$ as shown in FIG. 1. On the contrary, if the zeroth normal bit line $BL_0$ in the zeroth normal memory cell block $A_0$ is connected to the sense amplifier SA in the first sense amplifier block $B_1$, the first normal bit line $BL_1$ may be connected to the sense amplifier SA in the zeroth sense amplifier block $B_0$ as shown in FIG. 2.

The first sense amplifiers 10 and 20 in the zeroth sense amplifier block $B_0$ will be described by way of example in order to compare the structures of FIGS. 1 and 2.

Referring to FIG. 1, the first sense amplifier 10 in the zeroth sense amplifier block $B_0$ is connected to the zeroth bit line $BL_0$ in the first dummy cell block $DA_1$ and the zeroth bit line $BL_0$ in the zeroth normal memory cell block $A_0$. The sense amplifier 10 is laid out in two bit line pitches. That is, the sense amplifiers SA in the zeroth sense amplifier block $B_0$ including the sense amplifier 10 are connected to even bit lines $BL_0, BL_2, \ldots BL_{n-1}$ (where n is a natural odd number) in the normal memory cell block $A_0$ located at the right of the zeroth sense amplifier block $B_0$ and even bit lines $BL_0$, $BL_2, \ldots BL_{n-1}$ in the first dummy cell block $DA_1$, respectively. Alternatively, the sense amplifiers SA in the zeroth sense amplifier block $B_0$ can be connected to odd bit lines $BL_1, BL_3, \ldots BL_n$ in the normal memory cell block $A_0$ and odd bit lines $BL_1, BL_3, \ldots BL_n$ in the first dummy cell block $DA_1$ which are located at both sides of the zeroth sense amplifier block $B_0$, respectively. Here, it is assumed that n is an odd number.

Referring to FIG. 2, the first sense amplifier 20 in the zeroth sense amplifier block $B_0$ is connected to the zeroth bit line $BL_0$ in the first dummy cell block $DA_1$ and the first bit line $BL_1$ in the zeroth normal memory cell block $A_0$. The sense amplifier 20 is laid out in two bit line pitches. That is, sense amplifiers SA in the zeroth sense amplifier block $B_0$ including the sense amplifier 20 are connected to odd bit lines $BL_1$, $BL_3, \ldots BL_n$ in normal memory cell block $A_0$ located at the right of the zeroth sense amplifier block $B_0$ and even bit lines $BL_0, BL_2, \ldots BL_{n-1}$ in the first dummy cell block $DA_1$, respectively. Alternatively, the sense amplifiers SA in the zeroth sense amplifier block $B_0$ can be connected to even bit lines $BL_0, BL_2, \ldots BL_{n-1}$ in the normal memory cell block $A_0$ and odd bit lines $BL_1, BL_3, \ldots BL_n$ in the first dummy cell block $DA_1$ which are located at both sides of the zeroth sense amplifier block $B_0$, respectively. Here, it is again assumed that n is an odd number.

As described above, since the sense amplifiers SA of FIGS. 1 and 2 are laid out in two bit line pitches, so that they can be more easily aligned as compared to sense amplifiers laid out in a one bit line pitch.

Here, among the bit lines in the dummy cell blocks $DA_1$ and $DA_2$ located at both sides of the normal memory cell blocks $A_0$ to $A_k$, the bit lines connected to the sense amplifiers SA in the normal sense amplifier blocks $B_0$ and $B_{k+1}$ are normal bit lines connected to the memory cells, and the bit lines that are not connected to the sense amplifiers SA are dummy bit lines connected to the dummy cells. In FIGS. 1 and 2, the even bit lines $BL_0, BL_2, \ldots BL_{n-1}$ in the first and second dummy cell blocks $DA_1$ and $DA_2$ are the normal bit lines, and the odd bit lines $BL_1, BL_3, \ldots BL_n$ are the dummy bit lines.

The dummy bit lines $BL_1, BL_3, \ldots BL_n$ thus may be held in a floating state. However, the dummy bit lines may have a power voltage or a bit line precharge voltage VBL applied to them in common, or may be grounded to prevent the dummy bit lines from remaining in a floating state.

Operation of the sense amplifier SA will now be described with reference to FIG. 3 in connection with the first sense amplifier 20 in the zeroth sense amplifier block $B_0$ shown in FIG. 2.

Figure 3:
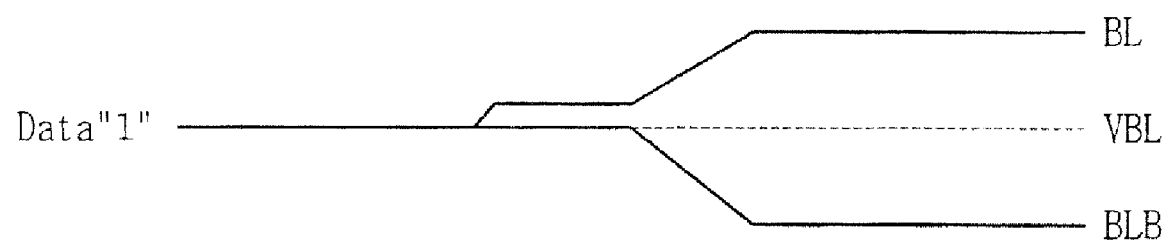
FIG. 3 is a data sensing timing diagram in FIGS. 1 and 2.
Figure 3:
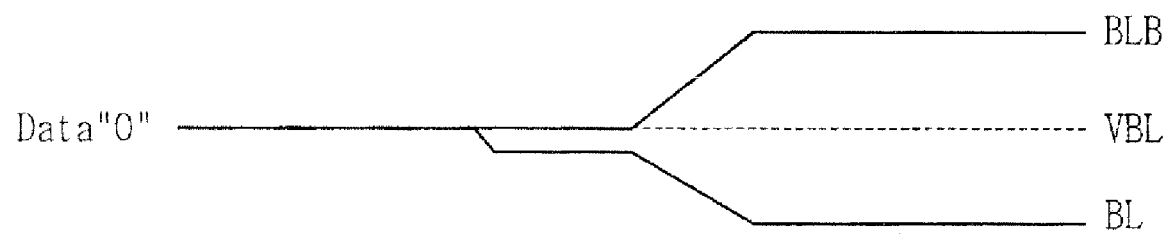

FIG. 3 is a timing diagram illustrating operation of the sense amplifier 20.

As shown in FIGS. 2 and 3, when a voltage corresponding to data stored in one memory cell connected to the first bit line $BL_1$ in the zeroth normal memory cell block $A_0$ is developed in the first bit line $BL_1$, the sense amplifier 20 compares a voltage on the first bit line $BL_1$ in the zeroth normal memory cell block $A_0$ to a precharge voltage (or a reference voltage VBL) on the zeroth bit line $BL_0$ in the first dummy cell block $DA_1$. The sense amplifier then senses whether the data developed in the first bit line $BL_1$ in the zeroth normal memory cell block $A_0$ is a data '1' or a data '0', and amplifies the data accordingly. In this case, the zeroth bit line $BL_0$ in the first dummy cell block $DA_1$ acts as a complementary bit line BLB for the first bit line $BL_1$ in the zeroth normal memory cell block $A_0$. On the contrary, when data stored in the memory cell connected to the zeroth bit line $BL_0$ in the first dummy cell block $DA_1$ is sensed, the first bit line $BL_1$ in the zeroth normal memory cell block $A_0$ acts as the complementary bit line BLB.

Thus, when a voltage corresponding to a data '1' is developed in the bit line BL, the voltage on the bit line BL has a higher level than the reference voltage VBL, which is a voltage on the complementary bit line BLB, and the sense amplifier 20 senses and changes the voltage on the bit line BL to a power voltage level VDD and the voltage on the complementary bit line BLB to a ground level VSS. When a voltage corresponding to a data '0' is developed in the bit line BL, the bit line (BL) voltage has a lower level than the reference voltage VBL, which is a voltage on the complementary bit line BLB, and the sense amplifier 20 senses and changes the bit line BL voltage to the ground level VSS and the complementary bit line (BLB) voltage to the power voltage level VDD.

The operation or structure of the semiconductor memory device of an open bit line method in which the sense amplifier SA is laid out in two bit line pitches as described above is well known to those skilled in the art, and thus a further description will be omitted.

As shown above, in semiconductor memory devices having the dummy cell structures shown in FIGS. 1 and 2, the dummy cells are not used for the operation of the semiconductor memory device except for the ease of specific manufacturing processes, such as convenient pattern design. In addition, when a refresh period is increased or a leakage current is generated in the memory cells, the sensing margin for sensing data stored in the memory cells may be reduced.

Figure 4:
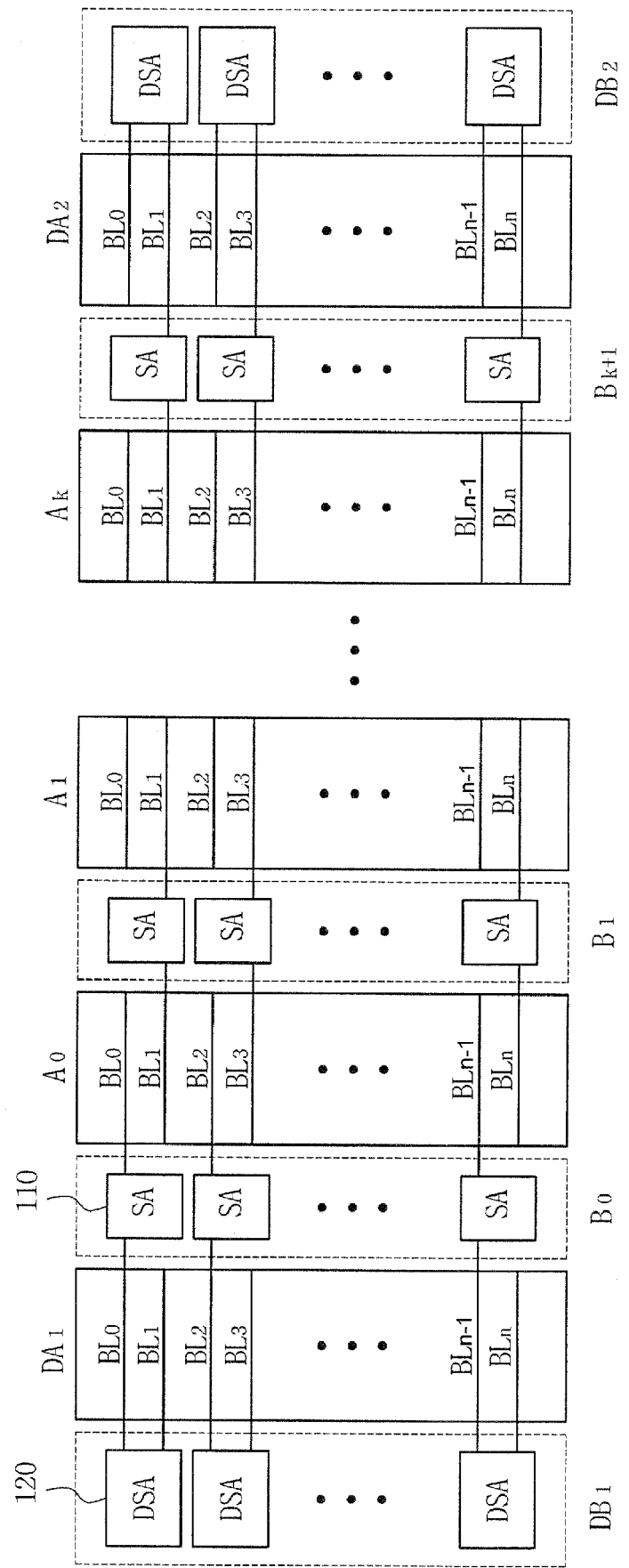
FIG. 4 illustrates the structure of a cell array in a semiconductor memory device according to an embodiment of the present invention.
Figure 5:
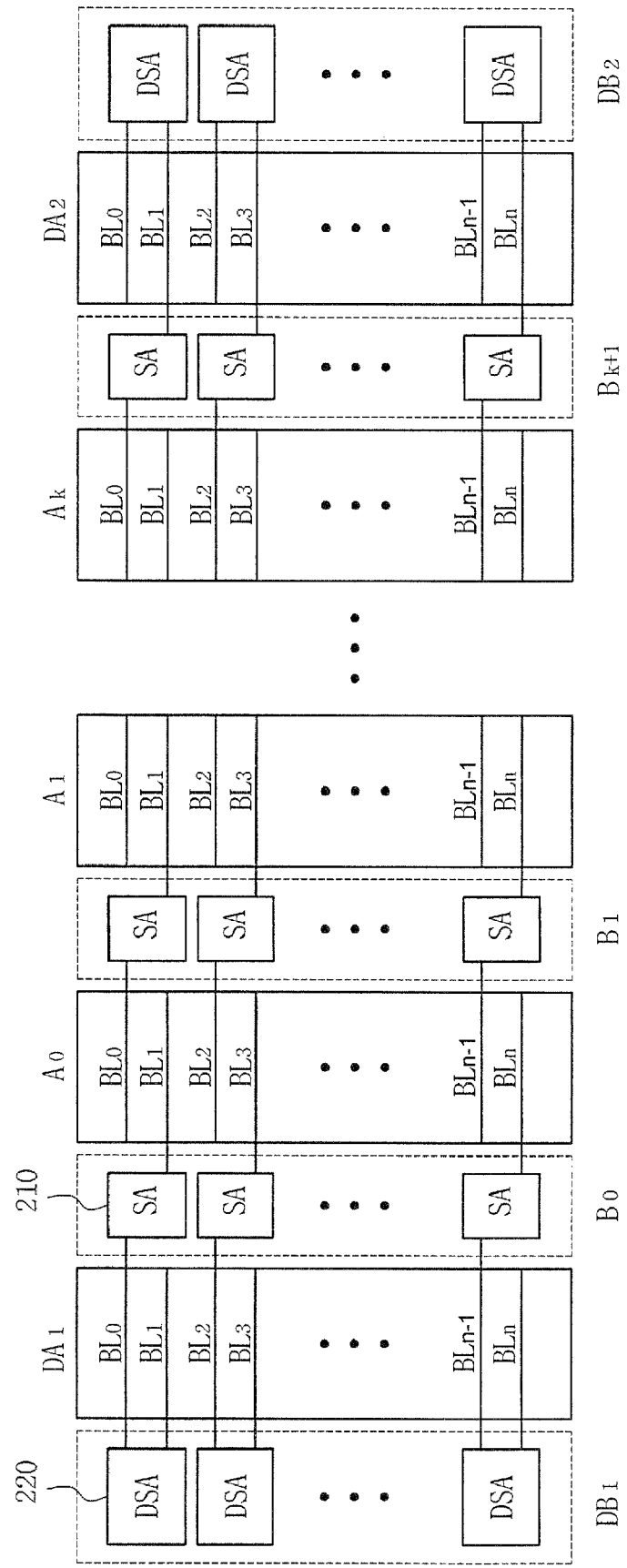
FIG. 5 illustrates the structure of a cell array in a semiconductor memory device according to another embodiment of the present invention.

FIG. 4 illustrates the structure of a memory cell array of a relax open bit line method in a semiconductor memory device according to an embodiment of the present invention, and FIG. 5 illustrates the structure of a memory cell array of a relax open bit line method in a semiconductor memory device according to another embodiment of the present invention. The memory cell arrays of FIGS. 4 and 5 have the same structure except for the connection of sense amplifiers, which will now be described.

Referring to FIGS. 4 and 5, a memory cell array in a semiconductor memory device includes k+1 (k is a natural number) normal memory cell blocks $A_0$ to $A_k$, first and second dummy cell blocks $DA_1$ and $DA_2$, normal sense amplifier blocks $B_0$ to $B_{k+1}$, and dummy sense amplifier blocks $DB_1$ and $DB_2$.

The first dummy cell block $DA_1$ is located at one edge of the normal memory cell blocks $A_0$ to $A_k$ (e.g., at the left of the zeroth normal memory cell block $A_0$), and the second dummy cell block $DA_2$ is located at the other edge of the normal memory cell blocks $A_0$ to $A_k$ (e.g., at the right of the k-th normal memory cell block $A_k$).

The normal memory cell blocks $A_0$ to $A_k$ have a structure in which a plurality of memory cells are laid out at the intersections between bit lines BL and word lines (not shown), and the first and second dummy cell blocks $DA_1$ and $DA_2$ have a structure in which memory cells and dummy cells are laid out at the intersections between the normal and the dummy bit lines and the word lines. Here, the memory cells are connected to the normal bit lines and the dummy cells are connected to the dummy bit lines.

The normal sense amplifier blocks $B_0$ to $B_{k+1}$ each include a number of normal sense amplifiers SA that are provided between the normal memory cell blocks $A_0$ to $A_k$ and between the normal memory cell blocks $A_0$ to $A_k$ and the first and second dummy cell blocks $DA_1$ and $DA_2$. All bit lines in the normal memory cell blocks $A_0$ to $A_k$ and normal bit lines BL in the first and second dummy cell blocks $DA_1$ and $DA_2$ are connected to the normal sense amplifiers SA in the normal sense amplifier block $B_0$ to $B_{k+1}$.

The zeroth normal memory cell block $A_0$ will now be described in detail by way of example.

The zeroth normal memory cell block $A_0$ includes a plurality of memory cells laid out in a predetermined structure. For example, the memory cells are connected to normal bit lines BL in a column direction and to word lines (not shown) in a row direction.

The zeroth normal sense amplifier block $B_0$ and the first normal sense amplifier block $B_1$ may be laid out at both sides of the zeroth normal memory cell block $A_0$. The normal bit lines BL formed in the zeroth normal memory cell block $A_0$ may be alternately connected to normal sense amplifiers SA of the zeroth normal sense amplifier block $B_0$ and normal sense amplifiers SA of the first normal sense amplifier block $B_1$. That is, if the zeroth normal bit line $BL_0$ in the zeroth normal memory cell block $A_0$ is connected to the normal sense amplifier SA in the zeroth normal sense amplifier block $B_0$, the first normal bit line $BL_1$ is connected to the normal sense amplifier SA in the first normal sense amplifier block $B_1$. On the contrary, if the zeroth normal bit line $BL_0$ in the zeroth normal memory cell block $A_0$ is connected to the normal sense amplifier SA in the first normal sense amplifier block $B_1$, the first normal bit line $BL_1$ may be connected to the normal sense amplifier SA in the zeroth normal sense amplifier block $B_0$.

The first normal sense amplifiers 110 and 210 in the zeroth normal sense amplifier block $B_0$ will be described by way of example in order to compare between the structures of FIGS. 4 and 5.

Referring to FIG. 4, the first normal sense amplifier 110 in the zeroth normal sense amplifier block $B_0$ may be connected to the zeroth bit line $BL_0$ in the first dummy cell block $DA_1$ and the zeroth bit line $BL_0$ in the zeroth normal memory cell block $A_0$. The sense amplifier 110 is laid out in two bit line pitches. That is, the normal sense amplifiers SA in the zeroth normal sense amplifier block $B_0$ including the normal sense amplifier 110 may be connected to even bit lines $BL_0$, $BL_2$, ... $BL_{n-1}$ (n is a natural odd number) in the normal memory cell block $A_0$ located at the right of the zeroth normal sense amplifier block $B_0$ and even bit lines $BL_0$, $BL_2$, ... $BL_{n-1}$ in the first dummy cell block $DA_1$, respectively. Alternatively, the normal sense amplifiers SA in the zeroth normal sense amplifier block $B_0$ may be connected to odd bit lines $BL_1$, $BL_3$, ... $BL_n$ in the normal memory cell block $A_0$ and odd bit lines $BL_1$, $BL_3$, ... $BL_n$ in the first dummy cell block $DA_1$, which are located at both sides of the zeroth normal sense amplifier block $B_0$, respectively. Here, it is assumed that n is an odd number.

Referring to FIG. 5, the first normal sense amplifier 210 in the zeroth sense amplifier block $B_0$ may be connected to the zeroth bit line $BL_0$ in the first dummy cell block $DA_1$ and the first bit line $BL_0$ in the zeroth normal memory cell block $A_0$. The normal sense amplifier 210 is laid out in two bit line pitches. That is, normal sense amplifiers SA in the zeroth normal sense amplifier block $B_0$ including the normal sense amplifier 210 may be connected to odd bit lines $BL_1$, $BL_3$, ... $BL_n$ in normal memory cell block $A_0$ located at the right of the zeroth normal sense amplifier block $B_0$ and even bit lines $BL_0$, $BL_2$, ... $BL_{n-1}$ in the first dummy cell block $DA_1$, respectively. Alternatively, the normal sense amplifiers SA in the zeroth normal sense amplifier block $B_0$ may be connected to even bit lines $BL_0$, $BL_2$, ... $BL_{n-1}$ in the normal memory cell block $A_0$ and odd bit lines $BL_1$, $BL_3$, ... $BL_n$ in the first dummy cell block $DA_1$ which are located at both sides of the zeroth normal sense amplifier block $B_0$. Here, it is again assumed that n is an odd number.

As described above, since the normal sense amplifiers SA of FIGS. 4 and 5 are laid out in the two bit line pitches, they can be more easily aligned as compared to normal sense amplifiers laid out in one bit line pitch.

Here, among the bit lines in the dummy cell blocks $DA_1$ and $DA_2$ located at both sides of the normal memory cell blocks $A_0$ to $A_k$, the bit lines connected to the normal sense amplifiers SA in the normal sense amplifier blocks $B_0$ and Bk+1 are normal bit lines connected to the memory cells, and the bit lines that are not connected to the normal sense amplifiers SA are dummy bit lines connected to the dummy cells. In FIGS. 4 and 5, the even bit lines $BL_0, BL_2, \ldots BL_{n-1}$ in the first and second dummy cell blocks $DA_1$ and $DA_2$ are the normal bit lines, and the odd bit lines $BL_1, BL_3, \ldots BL_n$ are the dummy bit lines.

However, unlike some semiconductor memory devices, these embodiments of the present invention include dummy sense amplifier blocks $DB_1$ and $DB_2$. That is, a first dummy sense amplifier block $DB_1$ connected to the first dummy cell block $DA_1$, and a second dummy sense amplifier block $DB_2$ connected to the second dummy cell block $DA_2$ are provided. Each of the dummy sense amplifier blocks $DB_1$ and $DB_2$ includes a plurality of dummy sense amplifiers DSA laid out between normal bit lines $BL_0, BL_2, \ldots BL_{n-1}$ and dummy bit lines $BL_1, BL_3$ and $BL_n$ in the dummy cell blocks $DA_1$ and $DA_2$. For convenience of illustration, the first dummy sense amplifiers 120 in FIG. 4 and 220 in FIG. 5 in the first dummy sense amplifier block $DB_1$ will be described by way of example.

In the first dummy sense amplifier block $DB_1$, the first dummy sense amplifiers 120 and 220 are connected between a normal bit line, which is the zeroth bit line $BL_0$ in the first dummy cell block $DA_1$ in these embodiments, and a dummy bit line, which is the first bit line $BL_1$ in the first dummy cell block $DA_1$ in these embodiments. Here, the normal bit line $BL_0$ is connected to the first normal sense amplifiers 110 and 210 in the zeroth normal sense amplifier block $B_0$.

The dummy sense amplifiers DSA in the dummy sense amplifier blocks $DB_1$ and $DB_2$ are connected to the memory cells and the dummy cells in the first and second dummy cell block $DA_1$ and $DA_2$, as reflected in the above-described embodiments including dummy sense amplifiers 120 and 220. The dummy sense amplifiers DSA may have the same structure as the normal sense amplifiers SA but are not connected to an input/output (I/O) line. Further, the dummy sense amplifiers DSA may always be kept at an operation state.

Figure 6:
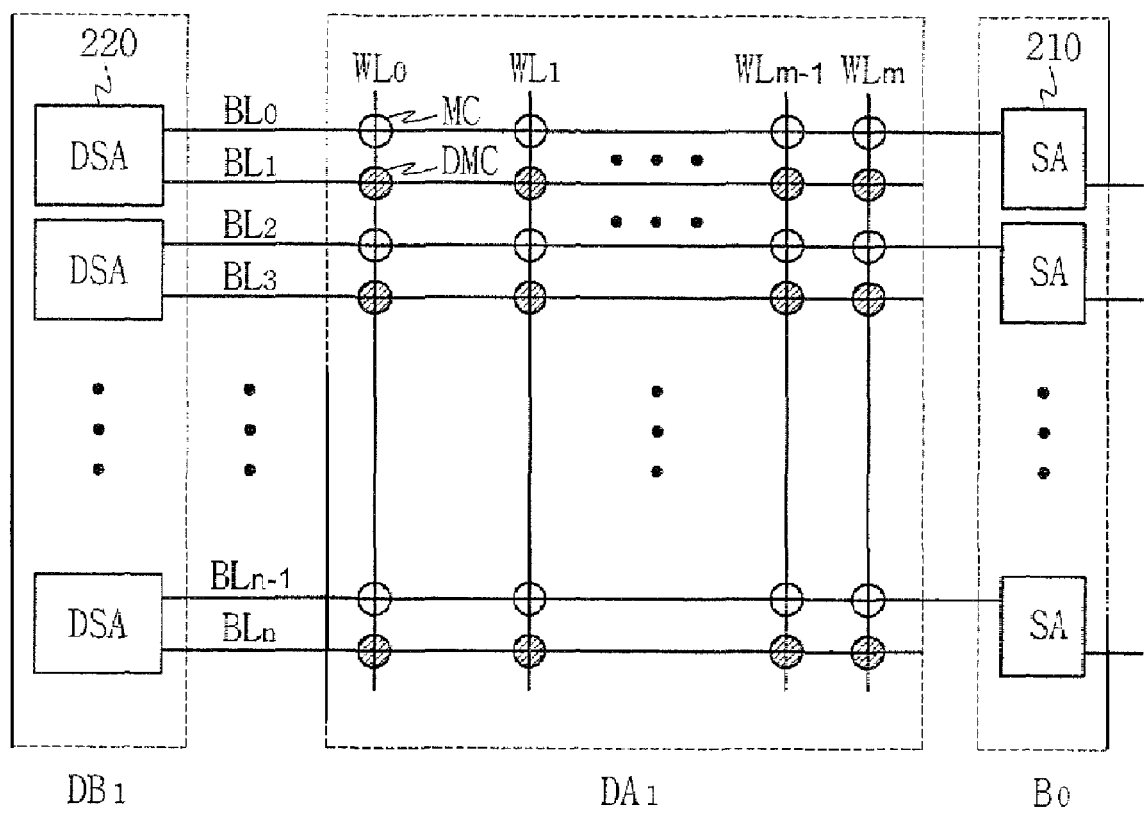
FIG. 6 is an enlarged view of a dummy cell block and a dummy sense amplifier block illustrated in FIG. 5.

FIG. 6 shows a detailed structure of the first dummy cell block $DA_1$ connected between the first dummy sense amplifier block $DB_1$ and the zeroth normal sense amplifier block $B_0$ illustrated in FIG. 5.

Referring to FIG. 6, the first dummy cell block $DA_1$ includes a plurality of memory cells and a plurality of dummy cells at the intersections of word lines WL and bit lines BL. For convenience, the memory cells are indicated by non-hatched circles at the intersections between the word lines WL and the bit lines BL, and the dummy cells are indicated by hatched circles at the intersections between the word lines WL and the bit lines BL.

As illustrated in this embodiment, even bit lines $BL_0, BL_2, \ldots BL_{n-1}$ of the bit lines BL are normal bit lines connected to the memory cells, and odd bit lines $BL_1, BL_3, \ldots BL_n$ are dummy bit lines connected to the dummy cells. When the memory cells connected to the even bit lines $BL_0, BL_2, \ldots BL_{n-1}$ and the dummy cells connected to the odd bit lines $BL_1, BL_3, \ldots BL_n$ share the word lines, they may be operated by the same address signal. For example, the memory cell MC located at the intersection between the zeroth bit line $BL_0$ and the zeroth word line $WL_0$ and the dummy cell DMC located at the intersection between the first bit line $BL_1$ and the zeroth word line $WL_0$ have the same address due to the first dummy sense amplifier 220 in the first dummy sense amplifier block $DB_1$.

Operation of sense amplifiers in this embodiment of the semiconductor memory device having the structure as described above will now be described. Here, because the operation of the normal sense amplifier SA is similar to the sense amplifier illustrated in FIG. 3, it will not be further described. The operation of the dummy sense amplifier, however, will now be described with reference to FIG. 6 and FIG. 7, which is a timing diagram of the dummy sense amplifier illustrated in FIG. 6.

Operation of a first dummy sense amplifier 220 of the dummy sense amplifiers DSA in the first dummy sense amplifier block $DB_1$ will now be described by way of example, in which data is store in a memory cell MC located at the intersection between the zeroth word line $WL_0$ and the zeroth bit line $BL_0$, or in which the data stored in the memory cell MC is sensed. Operation of the dummy sense amplifier 220 will also be described in connection with a dummy cell DMC having the same address as the memory cell MC.

The case where data '1' or complementary data '0' is stored in the memory cell MC will first be described.

First, the zeroth word line $WL_0$ is enabled, and then a voltage corresponding to the data to be stored is applied to the zeroth bit line $BL_0$ in the first dummy cell block $DA_1$ via the normal sense amplifier 210 in the zeroth normal sense amplifier block $B_0$. Accordingly, desired data is stored in the memory cell MC. Simultaneously, the dummy sense amplifier 220 delivers a voltage corresponding to data complementary to the data stored in the memory cell MC to the first bit line $BL_1$, which is a dummy bit line. For example, when a power voltage VDD is applied to the zeroth (here normal) bit line $BL_0$, a ground level voltage VSS is applied to the first (here dummy) bit line $BL_1$. Therefore, the dummy sense amplifier 220 acts as an inverter logic circuit during data write operation. Accordingly, the data complementary to data stored in the memory cell MC is stored in the dummy cell DMC.

The case where data '1' or '0' stored in the memory cell MC is sensed will now be described. This is shown in FIG. 7 as a timing diagram.

In operation of the dummy sense amplifier 220, the complementary bit line BLB always becomes a dummy bit line to which the dummy cell DMC is connected. Accordingly, in the above embodiment, the first bit line $BL_1$ becomes the complementary bit line BLB.

Figure 7:
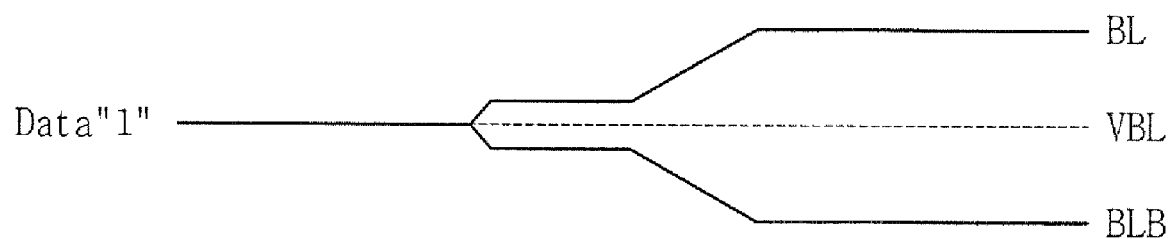
FIG. 7 is a data sensing timing diagram illustrating a dummy sense amplifier illustrated in FIGS. 4 to 6.
Figure 7:
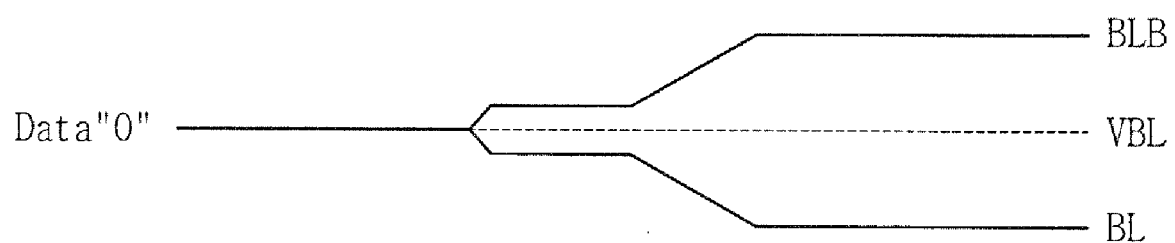

First, when a sensing operation is initiated, a voltage corresponding to the data stored in the memory cell MC is developed via the zeroth bit line $BL_0$ (represented by bit line BL in FIG. 7), and a voltage corresponding to the data stored in the dummy cell DMC is developed via the first bit line $BL_1$ (represented by complementary bit line BLB in FIG. 7). The dummy sense amplifier 220 senses and amplifies the developed voltages.

For example, as shown in FIG. 7, when a data '1' is stored in the memory cell MC and a data '0' is stored in the dummy cell DMC, a slightly higher voltage than the reference voltage VBL is developed in the zeroth bit line $BL_0$ (bit line BL), and a slightly lower voltage than the reference voltage is developed in the first bit line $BL_1$ (complementary bit line BLB). Further, when a data '0' is stored in the memory cell MC and a data '1' is stored in the dummy cell DMC, a slightly lower voltage than the reference voltage VBL is developed in the zeroth bit line $BL_0$ (bit line BL), and a slightly higher voltage than the reference voltage is developed in the first bit line $BL_1$ (complementary bit line BLB).

Accordingly, the dummy sense amplifier 220 senses and amplifies the developed data via the bit line BL using the voltage on the complementary bit line BLB as a reference voltage.

As described above, with the semiconductor memory device according to these embodiments of the present invention, it is possible to provide a sensing margin that is two times higher than a known sensing margin. That is, when the memory cell in the dummy cell block is sensed, the needed reference voltage level varies with the data and thus the sensing margin increases. In addition, when the refresh period is extended or a leakage current is generated in the memory cell, the data stored in the memory cell can still be sensed and thus the refresh margin can be improved.

Figure 8:
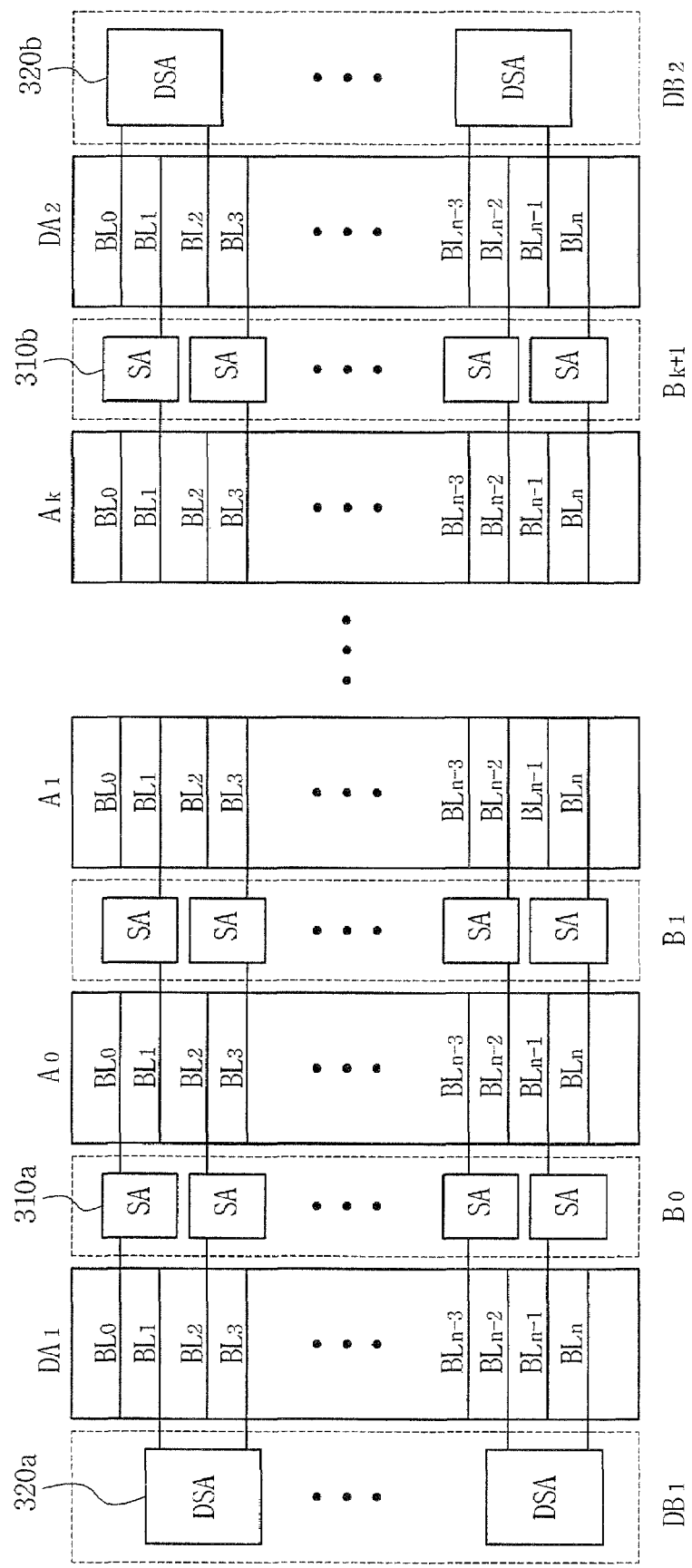
FIG. 8 illustrates the structure of a cell array in a semiconductor memory device according to yet another embodiment of the present invention.
Figure 9:
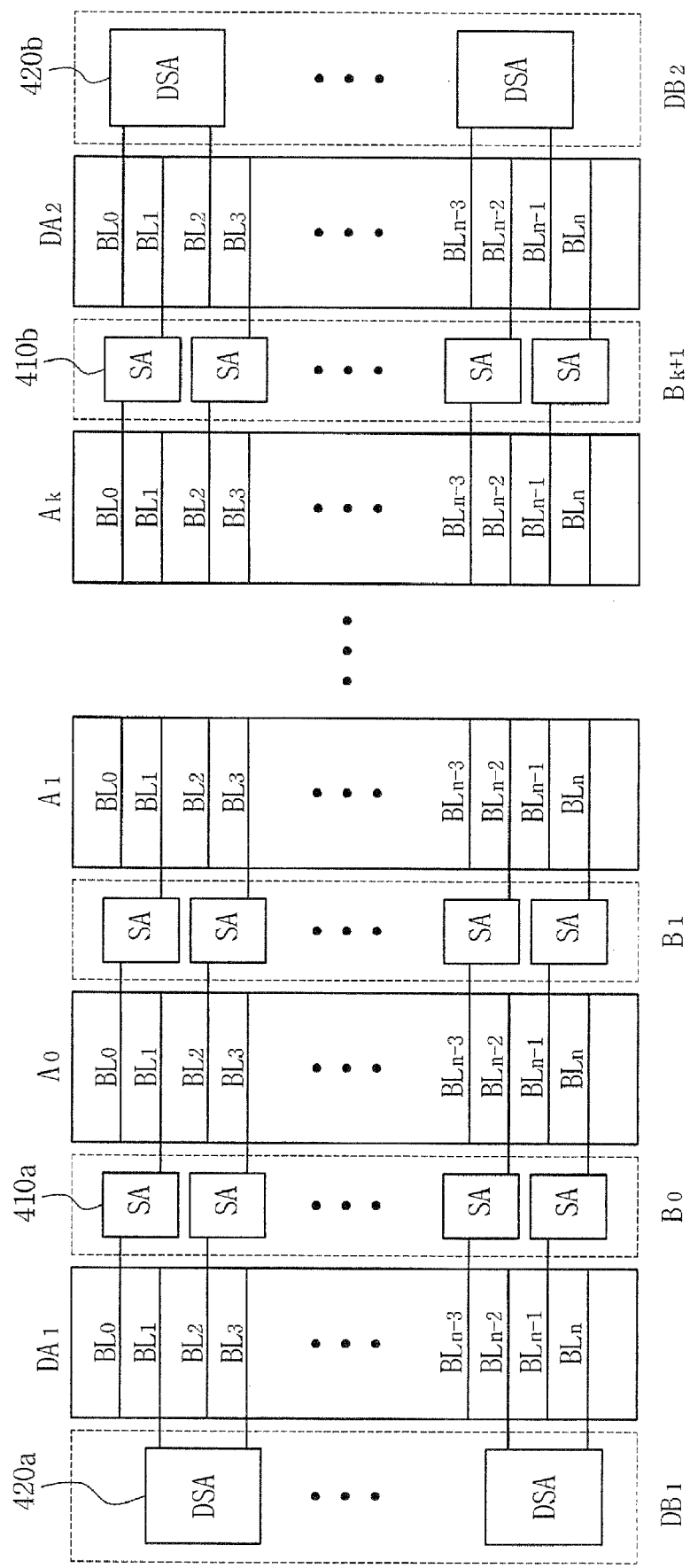
FIG. 9 illustrates the structure of a cell array in a semiconductor memory device according to still another embodiment of the present invention.

FIG. 8 illustrates the structure of a memory cell array of a relax open bit line method in a semiconductor memory device according to yet another embodiment of the present invention, and FIG. 9 illustrates the structure of a memory cell array of a relax open bit line method in a semiconductor memory device according to still another embodiment of the present invention.

Referring to FIGS. 8 and 9, in the semiconductor memory device according to these additional embodiments of the present invention, the memory cell array includes k+1 (k is a natural number) normal memory cell blocks $A_0$ to $Ak$, first and second dummy cell blocks $DA_1$ and $DA_2$, normal sense amplifier blocks $B_0$ to $B_{k+1}$, and dummy sense amplifier blocks $DB_1$ and $DB_2$.

The memory cell array of FIG. 8 has a similar structure to that of FIG. 4 except for the layout and connections of the dummy sense amplifier blocks $DB_1$ and $DB_2$. In addition, the memory cell array of FIG. 9 has a similar structure to that of FIG. 5 except for the layout and connections of the dummy sense amplifier blocks $DB_1$ and $DB_2$. Accordingly, only the dummy sense amplifier blocks $DB_1$ and $DB_2$ will be described below in detail.

In the embodiments of the present invention illustrated in FIGS. 8 and 9, a first dummy cell block $DA_1$ connected to the first dummy sense amplifier block $DB_1$ and a second dummy cell block $DA_2$ connected to the second dummy sense amplifier block $DB_2$ are provided. Each of the dummy sense amplifier blocks $DB_1$ and $DB_2$ includes a plurality of dummy sense amplifiers DSA laid out between the normal bit line $BL_0$, $BL_2$, $BLn-3$, . . . $BL_{n-1}$ and the dummy bit lines $BL_1$, $BL_3$, $BLn-2$, . . . $BL_n$ in the dummy cell blocks $DA_1$ and $DA_2$. Each of the plurality of dummy sense amplifiers DSA connects between any two of the dummy bit lines $BL_1$, $BL_3$, . . . $BL_{n-2}$, $BL_n$. For example, in FIG. 8 one dummy sense amplifier 320a of the dummy sense amplifiers DSA connects between the first bit line $BL_1$ and the third bit line $BL_3$ in the first dummy cell block $DA_1$.

For convenience of illustration, the first dummy sense amplifiers 320a and 420a in the first dummy sense amplifier block $DB_1$ of FIGS. 8 and 9 will be described by way of example.

The first dummy sense amplifiers 320a and 420a in the first dummy sense amplifier block $DB_1$ are connected between a dummy bit line that is the first bit line $BL_1$ in the first dummy cell block $DA_1$ and a dummy bit line that is the third bit line $BL_3$ in the first dummy cell block $DA_1$. Here, the dummy bit lines $BL_1$ and $BL_3$ have no connections to the normal sense amplifiers in the normal sense amplifier blocks $B_0$ to $B_{k+1}$.

The dummy sense amplifiers DSA constituting the dummy sense amplifier blocks $DB_1$ and $DB_2$ may be connected to the dummy cells in the first and second dummy cell block $DA_1$ and $DA_2$, as shown with the above-described dummy sense amplifiers 320a and 420a of FIGS. 8 and 9. The dummy sense amplifiers DSA have a similar structure to the normal sense amplifiers SA and may be connected to separate input/output (I/O) lines. Further, the dummy sense amplifiers DSA may operate only when one of the memory cells constituting the dummy cell blocks $DB_1$ and $DB_2$ fails.

A detailed layout structure and operation of the dummy sense amplifiers DSA of the embodiments illustrated in FIGS. 8 and 9 will now be described with reference to FIGS. 10, 11, and 7.

Figure 10:
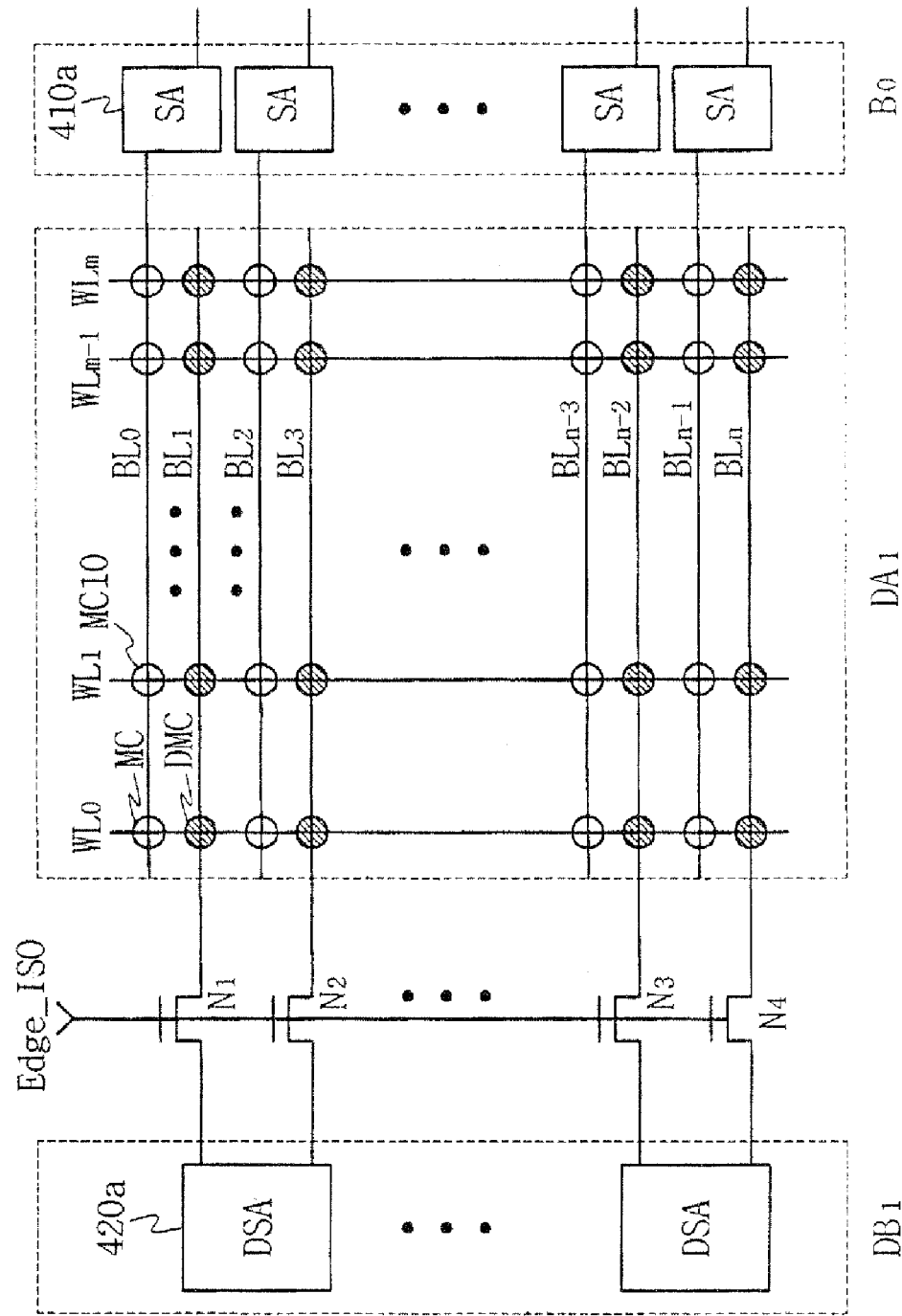
FIGS. 10 and 11 are enlarged views of a dummy cell block and a dummy sense amplifier block illustrated in FIG. 9.

FIG. 10 illustrates a detailed structure of the first dummy cell block $DA_1$ connected between the first dummy sense amplifier block $DB_1$ and the zeroth normal sense amplifier block $B_0$ illustrated in FIG. 9. FIG. 11 illustrates a detailed structure of the second dummy cell block $DA_2$ connected between the second dummy sense amplifier block $DB_2$ and the (k+1)-th normal sense amplifier block $B_0$ illustrated in FIG. 9.

Referring to FIG. 10, the first dummy cell block $DA_1$ includes a plurality of memory cells MC, and a plurality of dummy cells DMC at the intersections between word lines WL and bit lines BL. For convenience, the memory cells MC are indicated by non-hatched circles at the intersections between word lines WL and bit lines BL, and the dummy cells DMC are indicated by hatched circles at the intersections between the word lines WL and the bit lines BL.

Among the bit lines BL, even bit lines $BL_0$, $BL_2$, . . . $BLn-3$ and $BLn-1$ are normal bit lines connected to the memory cells MC, and odd bit lines $BL_1$, $BL_3$, . . . $BL_{n-2}$, $BL_n$ are dummy bit lines connected to the dummy cells DMC.

Each of the plurality of dummy sense amplifiers DSA in the first dummy sense amplifier block $DB_1$ connects any two of the dummy bit lines $BL_1$, $BL_3$, . . . $BL_{n-2}$, $BL_n$ in the first dummy cell block $DA_1$. Here, the dummy sense amplifiers DSA may be connected to the dummy bit lines via the switching devices N1, N2, N3, and N4. For example, one dummy sense amplifier 420a connects the first bit line $BL_1$ and the third bit line $BL_3$ in the first dummy cell block $DA_1$ via the switching devices N1 and N2.

Figure 11:
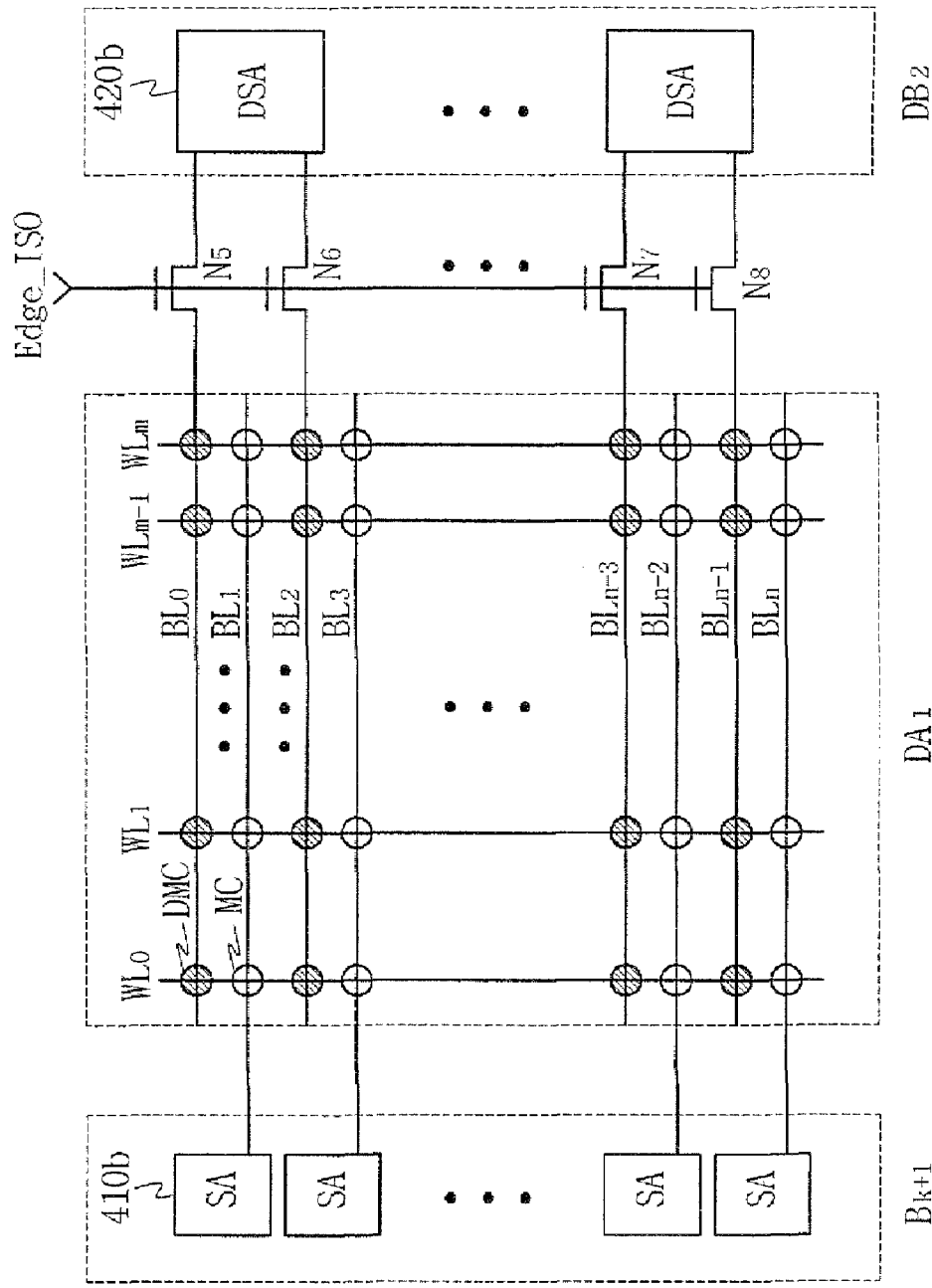

Referring to FIG. 11, the second dummy cell block $DA_2$ includes a plurality of memory cells MC and a plurality of dummy cells DMC at the intersections between word lines WL and bit lines BL. Again, for convenience, the memory cells MC are indicated by non-hatched circles at the intersections between word lines WL and bit lines BL, and the dummy cells DMC are indicated by hatched circles at the intersections between the word lines WL and the bit lines BL.

Even bit lines $BL_0$, $BL_2$, . . . $BL_{n-3}$, and $BL_{n-1}$ of the bit lines BL are dummy bit lines connected to the dummy cells DMC, and odd bit lines $BL_1$, $BL_3$, . . . $BL_{n-2}$, and $BL_n$ are normal bit lines connected to the normal memory cells MC.

Each of the plurality of dummy sense amplifiers DSA in the second dummy sense amplifier block $DB_2$ connects any two of dummy bit lines $BL_0$, $BL_2$, . . . $BL_{n-3}$, and $BL_{n-1}$ in the second dummy cell block $DA_2$. Here, the dummy sense amplifiers DSA are connected to the dummy bit lines via the switching devices N5, N6, N7 and N8. For example, one dummy sense amplifier 420b of the dummy sense amplifiers DSA connects the zeroth bit line $BL_0$ and the second bit line $BL_2$ in the second dummy cell block $DA_2$ via the switching devices N5 and N6. The dummy sense amplifiers DSA are connected to separate input/output lines.

Operation of the semiconductor memory device having the dummy sense amplifiers according to the embodiments illustrated in FIGS. 8-11 of the present invention will now be described by way of example in connection with the case when any of the normal memory cells in the dummy cell blocks $DA_1$ and $DA_2$ fails.

Referring to FIGS. 10 and 11, it is assumed that one memory cell MC10 of the normal memory cells connected to the zeroth bit line $BL_0$ that is a normal bit line in the first dummy cell block $DA_1$ fails. In this case, a connection is blocked between the zeroth normal sense amplifier block $B_0$ and the first dummy cell block $DA_1$. That is, a connection is blocked between the normal sense amplifiers 410a in the zeroth normal sense amplifier block $B_0$ and the normal bit lines $BL_0$, $BL_2$, ... $BL_{n-3}$ and $BL_{n-1}$ in the first dummy cell block $DA_1$. The connection blockage between the zeroth normal sense amplifier block $B_0$ and the first dummy cell block $DA_1$ can be addressed by the switching devices responsive to a signal that notifies of the occurrence of the failed memory cell MC10. The dummy sense amplifiers DSA in the first dummy sense amplifier block $DB_1$ and the second dummy sense amplifier block $DB_2$ may then operate to repair the failed memory cell MC10. That is, the dummy sense amplifiers DSA in the first dummy sense amplifier block $DB_1$ are electrically connected to the dummy bit lines $BL_1$, $BL_3$, ... $BL_{n-2}$, and $BL_n$ when a repair signal Edge_ISO is enabled, e.g., the repair signal Edge_ISO is pulled high. Further, the dummy sense amplifiers DSA in the second dummy sense amplifier block $DB_2$ are electrically connected to the dummy bit lines $BL_1$, $BL_3$, ... $BL_{n-2}$, and $BL_n$ as the repair signal Edge_ISO is enabled e.g. pulled high.

Accordingly, all the normal memory cells connected to all the normal bit lines $BL_0$, $BL_2$, ... $BL_{n-3}$ and $BL_{n-1}$ in the first dummy cell block $DA_1$ are electrically blocked from the zeroth normal sense amplifier block $B_0$ and the first dummy sense amplifier block $DB_1$. Then, the dummy cells DMC in the first dummy cell block $DA_1$ and the second dummy cell block $DA_2$ repair all the normal memory cells connected to all the normal bit lines $BL_0$, $BL_2$, ... $BL_{n-3}$ and $BL_{n-1}$ in the first dummy cell block $DA_1$. For example, all the normal memory cells connected to the zeroth bit line $BL_0$ that is the normal bit line are repaired by the dummy bit lines $BL_1$ and $BL_3$ connected to the dummy cells which are connected to the first dummy sense amplifier 420a. That is, the normal memory cell located at the intersection of the zeroth bit line $BL_0$ and the zeroth word line $WL_0$ are repaired by the dummy cell located at the intersection between the first bit line $BL_1$ and the zeroth word line $WL_0$ and the dummy cell having the same address and located at the intersection between the third bit line $BL_3$ and the zeroth word line $WL_0$. Here, data stored in the dummy cell located at the intersection between the first bit line $BL_1$ and the zeroth word line $WL_0$ and data stored in the dummy cell located at the intersection between the third bit line $BL_3$ and the zeroth word line $WL_0$ are stored to have a complementary relationship.

With the structure as described above, all the normal memory cells connected to the second bit line $BL_2$ (normal bit line) are repaired by the dummy cells connected to the dummy bit lines $BL_5$ and $BL_7$ which are connected to the first dummy sense amplifier 420a. Because two dummy bit lines are used to repair one normal bit line, normal memory cells that are not repaired in the first dummy cell block $DA_1$ are repaired by the dummy cells in the second dummy cell block $DA_2$.

With such a structure, all the normal memory cells MC connected to all the normal bit lines $BL_0$, $BL_2$, ... $BL_{n-3}$, and $BL_{n-1}$ in the first dummy cell block $DA_1$ can be repaired by all the dummy cells in the first dummy cell block $DA_1$ and the second dummy cell block $DA_2$.

With the structure as described above, no separate redundancy cell is necessary when the dummy cell block fails, thereby increasing redundancy efficiency. In addition, because two dummy cells are arranged to repair one normal memory cell and store complementary data, the sensing margin can be improved.

As another example, when one of the normal memory cells connected to the zeroth bit line $BL_0$ (normal bit line) in the first dummy cell block $DA_1$ fails, only a connection between the first normal sense amplifiers 310a, 410a in the zeroth normal sense amplifier block $B_0$ and the zeroth bit line $BL_0$ in the first dummy cell block $DA_1$ is blocked. To repair the normal memory cell, only the first dummy sense amplifier 320a, 420a of the dummy sense amplifiers DSA in the first dummy sense amplifier block $DB_1$ may operate.

Operation of the sense amplifiers illustrated in the above embodiments will now be described. The normal sense amplifier SA is similar to the normal sense amplifier SA illustrated in FIG. 3 and thus an additional description of its operation will be omitted. The operation of the dummy sense amplifier DSA will be described with reference to FIGS. 8-11 and the timing diagram of FIG. 7.

Here, the first dummy sense amplifier 420a of the dummy sense amplifiers DSA in the first dummy sense amplifier block $DB_1$ will be described by way of example. It is assumed that a normal memory cell located at the intersection between the zeroth bit line $BL_0$ and the zeroth word line $WL_0$ has been repaired by the dummy cell DMC located at the intersection between the zeroth word line $WL_0$ and the first bit line $BL_1$ and the dummy cell DMC located at the intersection between the zeroth word line $WL_0$ and the third bit line $BL_3$.

The case where a data '1' is stored in the dummy cells will now be described.

First, the zeroth word line $WL_0$ is enabled, and a voltage corresponding to a data '1' on the separate input/output line is applied to the first bit line $BL_1$ in the first dummy cell block $DA_1$ via the dummy sense amplifier 420a in the first dummy sense amplifier block $DB_1$. Accordingly, the data '1' is stored in the dummy cell DMC located at the intersection between the zeroth word line $WL_0$ and the first bit line $BL_1$. Simultaneously, a voltage corresponding to data '0' complementary to the data '1,' is applied to the third bit line $BL_3$ (also a dummy bit line) via the dummy sense amplifier 420a. Accordingly, a data '0' is stored in the dummy cell DMC located at the intersection between the zeroth word line $WL_0$ and the third bit line $BL_3$. For example, when a power voltage VDD is applied to the first bit line $BL_1$, a ground voltage VSS is applied to the third bit line $BL_3$. Thus, the dummy sense amplifier 420a operates as an inverter logic circuit during the data write operation. Accordingly, complementary data are stored in the two dummy cells DMC. It can easily be inferred that when a data '0' is to be stored, the operation is reversed.

The case where a data '1', stored in the dummy cells DMC, is sensed will now be described. Again this case can be shown with reference to FIGS. 8-10 and the timing diagram or FIG. 7.

In this embodiment, the operation of the dummy sense amplifier 420a can be shown where the third bit line $BL_3$ is represented by the complementary bit line BLB in FIG. 7 and where the first bit line $BL_1$ becomes the bit line BL in FIG. 7. However, as described above, the reverse configuration of these two lines is possible.

When the sensing operation is initiated, a voltage corresponding to a data '1' is developed via the first bit line $BL_1$ (the bit line BL), and a voltage corresponding to a complementary data '0' is developed via the third bit line $BL_3$ (the complementary bit line BLB). The dummy sense amplifier 420a may then sense and amplify the developed voltages.

Accordingly, a slightly higher voltage than the reference voltage VBL is developed in the first bit line $BL_1$ (the bit line BL), and a slightly lower voltage than the reference voltage is developed in the third bit line $BL_3$ (the complementary bit line BLB).

Thus, the dummy sense amplifier 420*a* can sense and amplify the developed data via the bit line BL using the voltage on the complementary bit line BLB as a reference voltage.

As described above, the semiconductor memory device according to the embodiments of the present invention can provide a sensing margin that is two times greater than the sensing margin in known devices. In addition, redundancy efficiency can be increased and the cell array can occupy a smaller area due to the use of dummy cells.

Therefore, it is possible to increase the sensing margin in sensing the memory cells in the dummy cell block by additionally providing dummy sense amplifiers. In addition, when the refresh period is increased and a leakage current is generated in the memory cell, data stored in the memory cell can still be sensed; thus improving the refresh margin. Further, if a memory cell fails, it can be repaired; hence improving redundancy efficiency. Also, the use of the dummy cells can reduce an area occupied by the cell array.

While the semiconductor memory device using an open bit line method has been described by way of example in the above-described embodiments, it will be apparent to those skilled in the art that the present invention is not limited to the embodiments but may be applied to all semiconductor memory devices including dummy cells.

Additionally, it should be noted that although the invention has been described using exemplary embodiments, it is to be understood that the scope of the invention is not limited to these disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

We claim the following:

1. A semiconductor memory device comprising:
   at least one dummy cell block including dummy cells and memory cells;
   normal bit lines to connect the memory cells in the dummy cell block in a first direction;
   dummy bit lines to connect the dummy cells in the first direction, wherein the dummy bit lines and the normal bit lines are alternatively laid out in a second direction in the dummy cell block; and
   a plurality of dummy sense amplifiers arranged in the second direction in a dummy sense amplifier block, each of the dummy sense amplifiers connecting any two of the normal bit lines and the dummy bit lines, where each dummy sense amplifier is connected between one of the normal bit lines and one of the dummy bit lines.

2. The device according to claim 1, where each dummy sense amplifier is structured to store data in at least one of the dummy cells in the dummy cell block that is complementary to data stored in at least one of the memory cells in the dummy cell block.

3. The device according to claim 2, where each dummy sense amplifier senses and amplifies data developed in the normal bit line using a voltage corresponding to data developed in the dummy bit line as a reference voltage.

4. The device according to claim 1, comprising:
   at least one normal sense amplifier; and
   a normal cell block adjacent to the dummy cell block, the normal memory cell block including a plurality of normal memory cells, where the normal bit lines are connected to second normal bit lines in the normal memory cell block via the normal sense amplifier.

5. The device according to claim 4, where the normal sense amplifier and the dummy sense amplifiers have the same structure.

6. The device according to claim 1, where the dummy sense amplifier is connected between any two of the dummy bit lines.

7. The device according to claim 6, where the dummy sense amplifier is structured to operate when one of the memory cells connected to the normal bit lines fails.

8. The device according to claim 7, where adjacent cells in a second direction among the dummy cells and the memory cells are connected to one another by a plurality of word lines.

9. The device according to claim 8, where dummy cells sharing one dummy sense amplifier and one word line among the dummy cells operate to store complementary data.

10. The device according to claim 6, where the dummy sense amplifier senses and amplifies data developed in one of the two dummy bit lines connected to the dummy sense amplifier using a voltage corresponding to data developed in the other dummy bit line as a reference voltage.

11. The device according to claim 6, where the dummy bit lines and the normal bit lines are alternately laid out in a second direction of the dummy cell block.

12. The device according to claim 6, comprising:
    at least one normal sense amplifier; and
    a normal cell block adjacent to the dummy cell block, the normal memory cell block including a plurality of normal memory cells, where the normal bit lines are connected to second normal bit lines in the normal memory cell block via the normal sense amplifier.

* * * * *